United States Patent [19]
Suzuki

[11] Patent Number: 5,808,950
[45] Date of Patent: Sep. 15, 1998

[54] SEMICONDUCTOR STORAGE DEVICE

[75] Inventor: Hiroaki Suzuki, Tokyo, Japan

[73] Assignee: NEC Corporation, Tokyo, Japan

[21] Appl. No.: 881,303

[22] Filed: Jun. 24, 1997

[30] Foreign Application Priority Data

Jun. 24, 1996 [JP] Japan ................................. 8-163408

[51] Int. Cl.⁶ .................................................. G11C 13/00
[52] U.S. Cl. ............... 365/203; 365/189.01; 365/230.01; 365/226
[58] Field of Search ............................. 365/203, 189.01, 365/230.01, 230.03, 226, 227

[56] References Cited

U.S. PATENT DOCUMENTS 5,193,073  3/1993  Bhuva ...................................... 365/226

FOREIGN PATENT DOCUMENTS 2-12693  1/1990  Japan .

Primary Examiner—Terrell W. Fears

[57] ABSTRACT

The invention provides a semiconductor storage device (RAM) which prevents discharging of a non-selected column, reduces the precharging time of a bit line and a complementary bit line, reduces the writing time upon writing into a memory cell and reduces the power consumption. The semiconductor storage device Includes a current line connected commonly to memory cells of each column of a memory cell array, and a current limiting circuit interposed between each current line and a power supply line. The current limit circuit is controlled in response to a column selection signal so that the value of current flowing through the memory cells of the column is different depending upon whether the column is selected or not selected.

9 Claims, 11 Drawing Sheets

SEMICONDUCTOR STORAGE DEVICE

BACKGROUND OF THE INVENTION

1. Field of the Invention

This invention relates to a semiconductor device, and more particularly to a semiconductor device in the form of a random access memory (RAM).

2. Description of the Related Art

Conventionally, various semiconductor storage devices (RAMs) which include a large number of RAM cells are known. One of known semiconductor storage devices is shown in FIG. 9, and one of RAM cells of the semiconductor storage device is shown in FIG. 10. Referring first to FIG. 10, the RAM cell shown includes a pair of invertors 1 and 2 and a pair of NMOS transistors 3 and 4. The source of the NMOS transistor 3 is connected to the input of the invertor 1 and the output of the invertor 2, and the source of the NMOS transistor 4 is connected to the input of the invertor 2 and the output of the invertor 1. The drains of the NMOS transistors 3 and 4 are connected to a bit line 5 and a complementary bit line 6, respectively, and the gates of the NMOS transistors 3 and 4 are connected to a word line 7.

Referring to FIG. 9, when data is to be read out or written into the semiconductor storage device, the bit lines and the complementary bit lines for the RAM cells are precharged first. After completion of the precharging, a row decoder 25a activates one of word lines 14 in response to an address signal so that data of those RAM cells connected to the activated word line are outputted to bit lines 15 to 18 and complementary bit lines 19 to 22. Data values of one of the bit line pairs (15 and 19, 16 and 20, 17 and 21, and 18 and 22) are read out to a data line 23 and a complementary data line 24 by a column selection switch 26a including a large number of column selection transistors which are controlled by a column decoder 28a. The data values read out by the column decoder 28a are amplified by a data amplifier 27a and outputted from the semiconductor storage device.

In the conventional semiconductor storage device, if the values of the RAM cells 10 to 13 are LOW, then the levels of the bit lines 15 to 18 vary from a precharge level to a LOW level. In other words, current flows to ground lines. Since the complementary bit lines 19 to 22 remain at a precharge level, no consumption current flows therethrough. Here, if it is assumed that the bit line 15 and the complementary bit line 19 are selected, then the values are sent to the data line 23 and the complementary data line 24, respectively. In this instance, however, the values of the bit lines 16 to 18 and the complementary bit lines 20 to 22 which are not selected are not referred to at all. In other words, although the variations of those bit lines are no essentially required operations, consumption current flowing from those bit lines to the ground lines is redundant.

An improved semiconductor storage device which reduces power consumption of such bit lines which are not selected by column selection transistors as described above is proposed in Japanese Patent Laid-Open Application No. Heisei 2-12693. The semiconductor storage device, however, is in the form of a read only memory (ROM), and the construction of it is shown in FIG. 11.

In the semiconductor storage device shown in FIG. 11, precharging of a bit line 26 is performed by a column selection transistor 27 of a bit line decoder 27b using a precharge circuit connected to a data line 25. Accordingly, precharging of any bit line which is not selected is not performed, and as a result, power consumption of bit lines which are not selected is reduced.

However, if it is tried to apply the technique described just above to a static RAM (SRAM), then the following problems take place.

In particular, normally since a RAM cell outputs complementary values, if the potentials of a bit line and a complementary bit line which are not precharged are a LOW level, then charging current flows between one of the bit line and the complementary bit line and a power supply line. Consequently, the aimed effect of reduction of power consumption is cancelled.

Further, since a bit line and a complementary bit line which are not selected by the corresponding column transistors are not precharged, the potentials of them become unstable. Thus, there is the possibility that the potentials of the bit line and the complementary bit line may become opposite to a value held in the RAM cell, resulting in variation of the value held by the RAM cell.

Furthermore, the column selection control signal is produced by decoding part of an address of the semiconductor storage device, and if such decoding is performed within a precharging period, then since precharging of the bit lines is performed after decoding of the column selection control signal and switching of the column selection transistors are completed, the precharging period increases by the time required for the decoding. Further, although the precharging period does not increase if decoding of the column selection control signal is completed before a precharging period starts, the set-up time for the precharging period of an address of the semiconductor storage device must be increased. Therefore, whichever one of the two methods is employed, the operation time of the SRAM, that is, the precharging time+read time, increases and the operation frequency decreases.

As a countermeasure to reduce the power consumption of non-selected columns, it seems a possible idea to dispose, for the individual columns, column selection signals in the same direction as the bit lines and prevent discharging of bit lines of non-selected columns by means of the column selection signals and transistors additionally provided between the bit lines and the RAM cells. This countermeasure, however, requires provision of new wiring lines of column selection control lines between the RAM cells arranged in a matrix and further requires provision of the new transistors individually between the RAM cells and the bit lines, resulting in increase of the layout area. Consequently, the countermeasure is disadvantageous in that it is not suitable for high integration.

SUMMARY OF THE INVENTION

It is an object of the present invention to provide a semiconductor storage device which is low in power consumption.

It is another object of the present invention to provide a semiconductor storage device wherein the precharging period is reduced and a high speed operation is achieved.

It is a further object of the present invention to provide a semiconductor storage device wherein the noise margin of a RAM cell is increased to assure a high degree of reliability.

It is a still further object of the present invention to provide a semiconductor storage device wherein the writing time into a RAM cell is reduced to reduce power consumption upon writing.

In order to attain the objects described above, according to an aspect of the present invention, there is provided a semiconductor storage device, comprising a memory cell array including a plurality of bit line pairs, a plurality of word lines and a plurality of memory cells arranged in a matrix and individually connected to corresponding ones of the bit line pairs and the word lines, a column selection circuit for selecting one of the bit line pairs in response to a column selection signal and connecting the selected bit line pair to a pair of data lines, a current line connected commonly to those of the memory cells which are disposed in each of columns in the memory array, and a current limiting circuit interposed between each of the current lines and a power supply line and having a value of current to flow therethrough which is variable in response to the column selection signal.

In the semiconductor storage device having the construction described above, the value of current between a discharge line and a ground line of a non-selected column is limited. Consequently, the power consumption of a non-selected column by discharging of a bit line is reduced. Further, the noise margin of RAM cells of a non-selected column is expanded, and consequently, the reliability is improved.

Preferably, when the bit line pairs are precharged, adjacent ones of the bit line pairs are equalized. Thus, a bit line and a complementary bit line of adjacent columns are equalized in this manner, and consequently, the precharging times of the bit lines are reduced.

According to another aspect of the present invention, there is provided a semiconductor storage device, comprising a plurality of memory cells arranged in a matrix, a write driver for writing data into those of the memory cells selected in response to a column selection signal, a current line connected commonly to those of the memory cells which are disposed in each of columns of the matrix, and a current limiting circuit interposed between each of the current lines and a power supply line, and wherein current to flow through the current limiting circuit upon writing of data by the write driver is varied in response to the column selection signal.

In the semiconductor storage device, the value of current between a charge line and a power supply line of a selected column is limited upon writing of a RAM cell. Consequently, the writing time is reduced and the power consumption upon writing is reduced.

Since the semiconductor storage devices according to the present invention are constructed as described above, each of them has the following advantages. First, the power consumption can be reduced. Consequently, where the semiconductor storage device is applied to a system which employs a dry cell such as a portable system which may be carried for a long time, it allows a long time use of the system. The reason is that discharge current of bit lines and complementary bit lines of non-selected columns is reduced.

The second advantage of the semiconductor storage device resides in that the operation frequency is high. Consequently, the semiconductor storage device can be applied to a system which operates at a high speed. The reason is that precharging time can be reduced by equalizing a bit line and a complementary bit line of adjacent columns.

The third advantage resides in that writing into the semiconductor storage device can be performed at a high speed. Consequently, the semiconductor storage device can be applied to a system which operates at a high speed. The reason is that the switching voltage drops by limiting the value of current between each RAM cell and a power supply line.

The fourth advantage resides in that the power consumption of the semiconductor storage device upon writing can be reduced. Consequently, the semiconductor storage device can be applied to a system whose power consumption is limited. The reason is that the value of current to flow between each RAM cell and a power supply line is limited.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
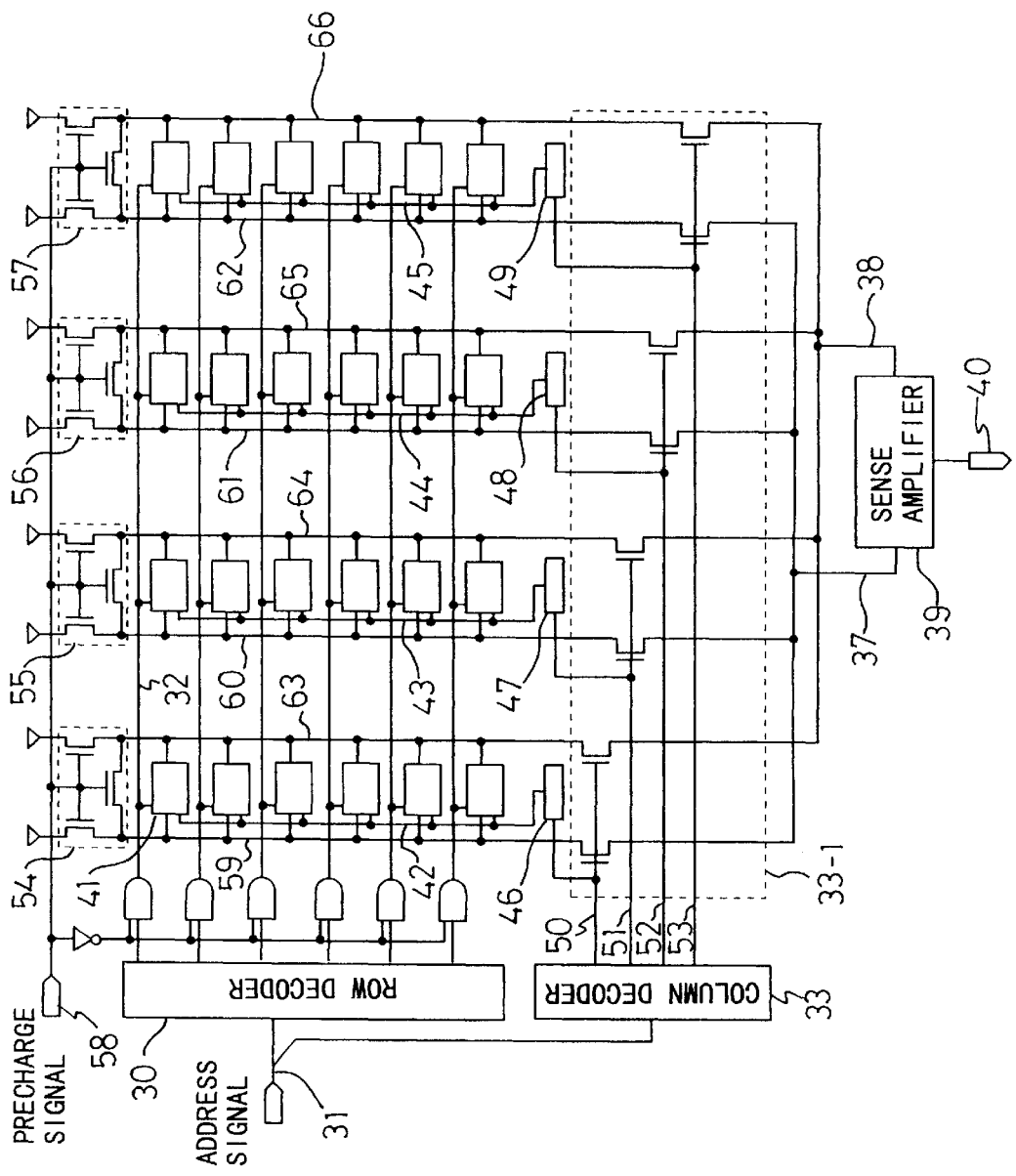
FIG. 1 is a block diagram of a semiconductor storage device showing a preferred embodiment of the present invention.

Referring to FIG. 1, there is shown a semiconductor storage device to which the present invention is applied. The semiconductor storage device shown includes RAM cells 41 and so forth arranged in a matrix, a row selection decoder 30, a column decoder 33, a column selection circuit 33-1, current limitation circuits 46 to 49, precharge circuits 54 to 57, and a sense amplifier 39.

The row selection decoder 30 decodes part of an address signal 31 and renders one of word lines, for example, a word line 32, active. Meanwhile, the column decoder 33 decodes the other part of the address signal 31 and renders one of column selection signals, for example, a signal on a column selection control line 50, active. The column selection circuit 33-1 selects, in response to the column selection signal, a bit line pair 59 and 63 for a pair of bits from among a plurality of bit lines 59 to 62 and a plurality of complementary bit lines 63 to 66 and connects the bit line pair 59 and 63 to a data line 37 and a complementary data line 38, respectively. The sense amplifier 39 detects a potential difference between the data line 37 and the complementary data line 38 to produce a data output signal 40.

Each of the RAM cells 41 and so forth arranged in a matrix outputs, when a word line connected thereto is active, complementary values held in the inside thereof to corresponding one of the bit lines and complementary bit lines. In the semiconductor storage device of FIG. 1, reference nodes of the RAM cells in the same columns are connected to discharge lines 42 to 45, which are connected to current limitation circuits 46 to 49, respectively. The current limitation circuits 46 to 49 are in turn connected to column selection control lines 50 to 53, respectively, so that the current control circuits of those columns which are not selected decrease the current to flow between the discharge lines and the ground lines.

The precharge circuits 54 to 57 precharge the bit lines 59 to 62 and the complementary bit lines 63 to 66, respectively, in response to a precharge signal 58 and each equalizes a bit line and a complementary bit line in the same column corresponding thereto. To this end, the precharge circuits 54 to 57 are constructed in such a manner as seen in FIG. 1.

Figure 2:
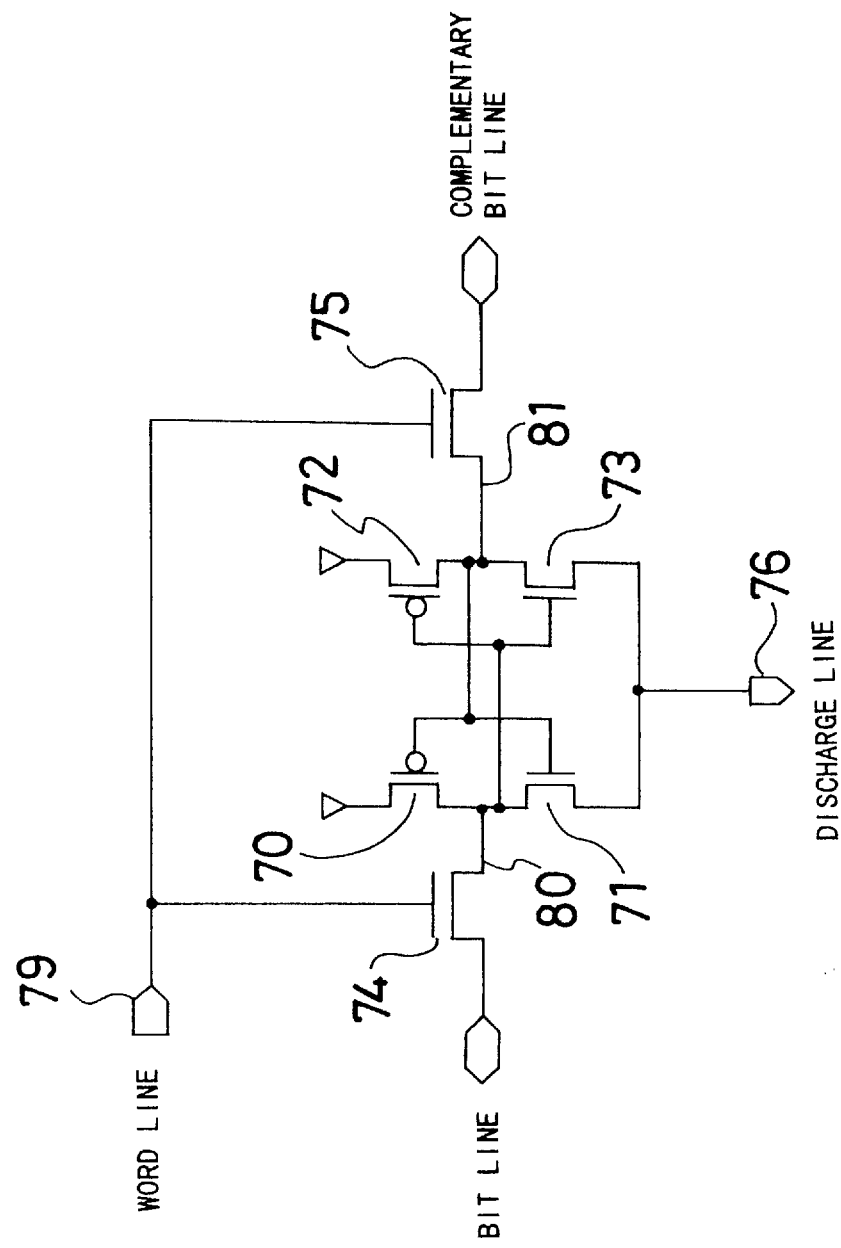
FIG. 2 is a circuit diagram of a RAM cell included in the semiconductor storage device of FIG. 1.

FIG. 2 shows an example of circuit construction of each of the RAM cells shown in FIG. 1. Referring to FIG. 2, the RAM cell shown includes a transistor 74, a pair of PMOS transistors 70 and 72, a pair of NMOS transistors 71 and 73, and another transistor 75.

The sources of the PMOS transistors 70 and 72 are connected to power supply lines, and the sources of the NMOS transistors 71 and 73 are connected to a discharge node 76. The drains of the transistors 70 and 71, the gates of the transistors 72 and 73 and the source of the transistor 74 are connected commonly. The drains of the transistors 72 and 73, the gates of the transistors 70 and 71 and the source of the transistor 75 are connected commonly. The gates of the transistors 74 and 75 are connected to a word line 79, and the drain of the transistor 74 is connected to a bit line 77 while the drain of the transistor 75 is connected to a complementary bit line.

Figure 3:
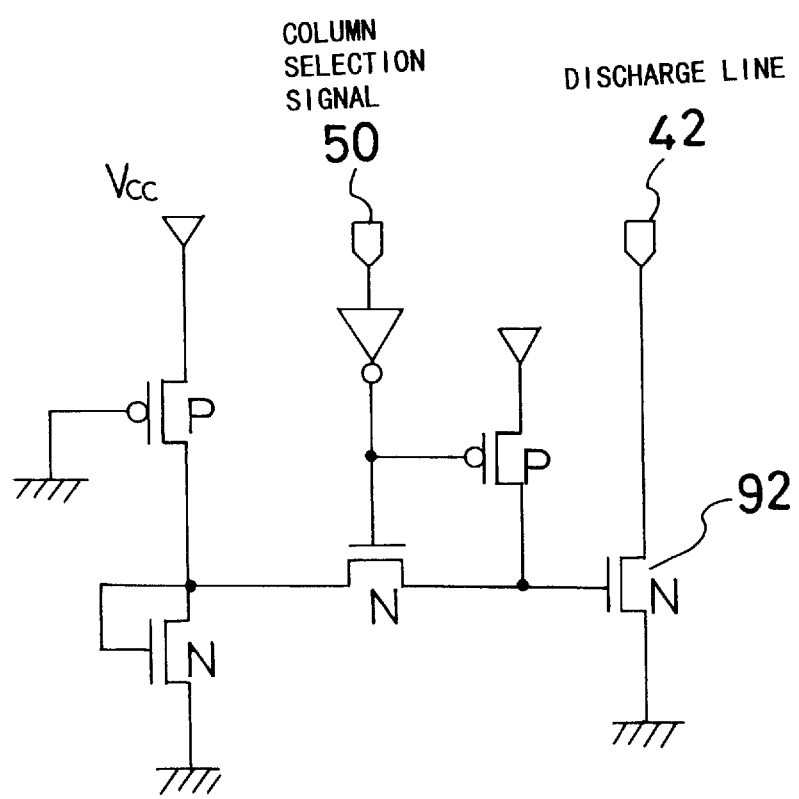
FIG. 3 is a circuit diagram of a current limiting circuit included in the semiconductor storage device of FIG. 1.

FIG. 3 shows an example of construction of the current limitation circuit 46 shown in FIG. 1. Also the other current limitation circuits 47 to 49 have the same construction. Referring to FIG. 3, the circuit shown employs a current mirror type load circuit, and since the potential of an NMOS transistor 92 is in a saturation region when the potential of the column selection control line 50 is LOW, fixed current flows between the source and the drain of the NMOS transistor 92. On the other hand, when the column selection control line 50 has a HIGH level, since the potential of the NMOS transistor 92 is in a linear region, current corresponding to the voltage Vds flows through the NMOS transistor 92. In other words, when the column selection control line 50 has a HIGH level, the NMOS transistor 92 substantially acts as a switch to ground the discharge line 42. Accordingly, when the column selection control signal 50 has a LOW level, low current as a current mirror circuit flows through the NMOS transistor 92, but when the column selection control signal 50 has a HIGH level, high current flows through the NMOS transistor 92.

Figure 4:
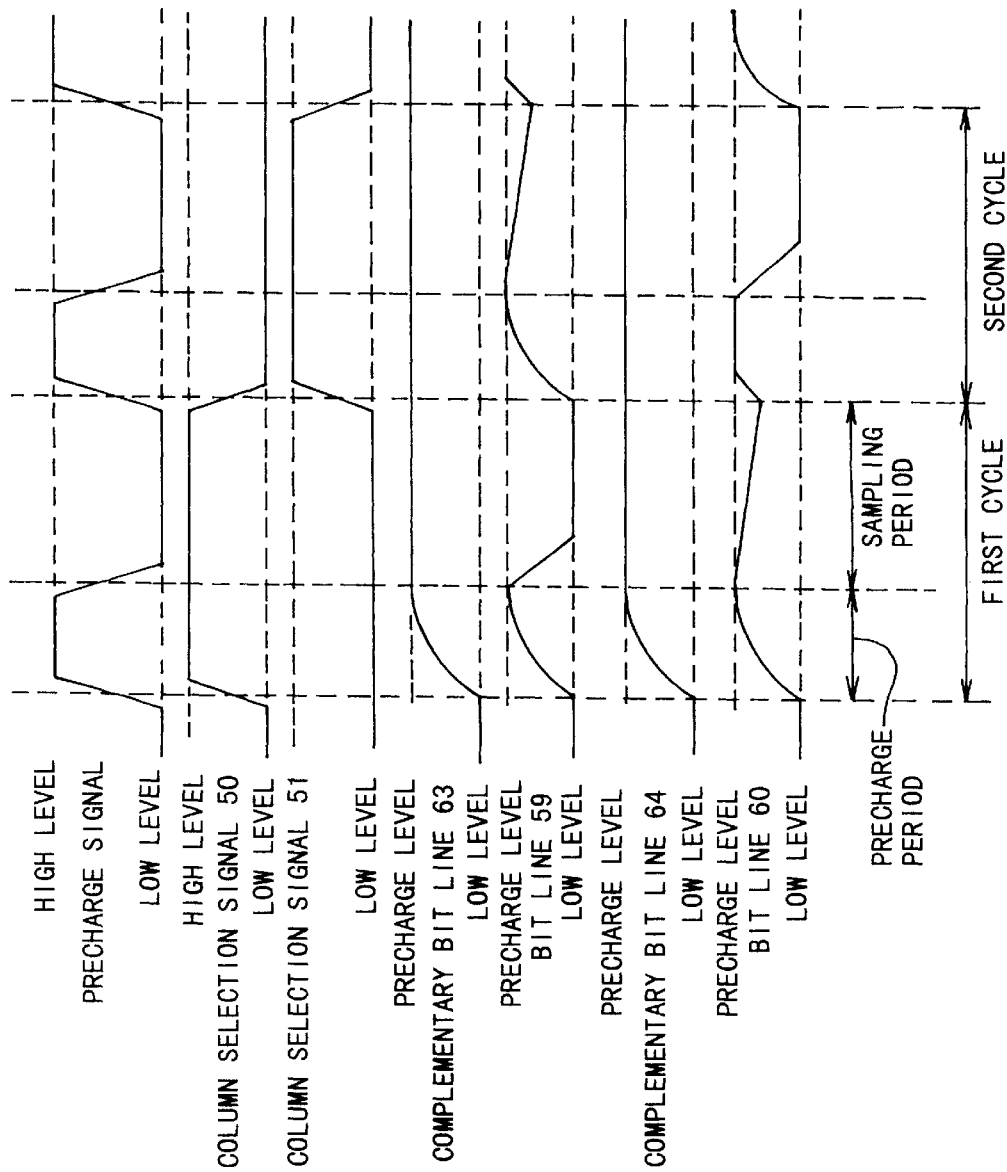
FIG. 4 is a timing chart illustrating operation of the semiconductor storage device of FIG. 1.

Subsequently, operation of the circuit of FIG. 1 is described with additional reference to the timing chart of FIG. 4.

It is assumed that the value "0" is stored in the RAM cell 41. It is further assumed that, within a first cycle of the precharge signal, a column including the bit line 59 is selected in response to the column selection control line 50, and within a second cycle, another column including the bit line 60 is selected in response to the column selection signal 51.

If the potential of the precharge signal 58 becomes HIGH, then the precharge circuits 54 to 57 operate so that the bit lines 59 to 62 and the complementary bit lines 63 to 66 are precharged to a precharge level. While the precharge signal remains HIGH, row selection decoding and column selection decoding are completed, and the column selection control lines 50 and 51 are settled. When the potential of the precharge signal 58 becomes LOW, the precharging operation is completed and a sampling period is started. The word line 32 is rendered active, and the transistors 74 and 75 in those RAM cells connected to the word line 32 are turned on so that discharging of the bit line 77 is started. The charge accumulated in the bit line 77 is discharged to the ground line past the transistors 74, 71 and 92.

Here, precharging in the second cycle in which the column including the bit line 59 is not selected is considered. Since the current to flow through the NMOS transistor 92 is suppressed row, discharging of the bit line proceeds more slowly than that when the column is selected. Consequently, precharging and sampling are performed repetitively in a cycle longer than a certain period, the potential of the bit line 60 of the selected column varies to a LOW level before precharging is started. However, since the potential of the bit line 59 of a non-selected line varies to an intermediate potential and does not vary fully to a LOW level, only part of charge accumulated on the bit line is discharged. Consequently, the bit line discharge current of the non-selected line can be reduced.

It is to be noted that, if the current limit value of the current limitation circuits 46 to 49 is set to a low value, then the degree of reduction of the discharge current increases, but the potential at the not 80 further approaches the (potential of the bit line 77—threshold voltage of the transistor 74). If, when the RAM cell has the value "LOW", the voltage of the node 80 exceeds the switching voltage of the invertor formed from the transistors 72, 73 and 92, then the value of the output node 81 of the invertor reverses and destroys the value of the RAM cell. However, since the switching voltage of the invertor is equal to a voltage when the currents flowing through the PMOS and NMOS transistors in the invertor become equal to each other, if the current through the NMOS transistor 92 is limited, then the switching voltage of the transistor of the invertor rises. Further, since the potential of the node 76 is not equal to the potential of the ground line, the voltage between the source of the transistor 73 and the substrate exhibits a positive value, and consequently, the threshold voltage of the transistor 73 rises due to a substrate effect of the MOS transistor. Consequently, the switching voltage of the invertor further rises. As a result, if the current limit value of the current limiting circuits is set to a low value, then a wide noise margin (potential difference between the switching voltage of the invertor and the potential at the node 80) can be assured for the RAM cell, and destruction of the value of the RAM cell can be prevented and the reliability can be raised.

Further, since the present storage device can be realized by replacing the grounding wiring lines with the discharge wiring lines, it is free from an increase in area and can be formed as a high integration storage device.

In the semiconductor storage device of the embodiment of the present invention described above, within a sampling period, the potential of one of a bit line and a complementary bit line of a selected column varies to a precharge level while the potential of the other varies to a LOW level, and the potential of one of a bit line and a complementary bit line of each non-selected column varies to a precharge level while the potential of the other varies to an intermediate level. Consequently, compared with precharging and equalization of each non-selected column, in precharging and equalization of a selected column, the potential difference between a bit line and a complementary bit line is larger. Therefore, a longer time is required for precharging and equalization of a selected column.

Figure 5:
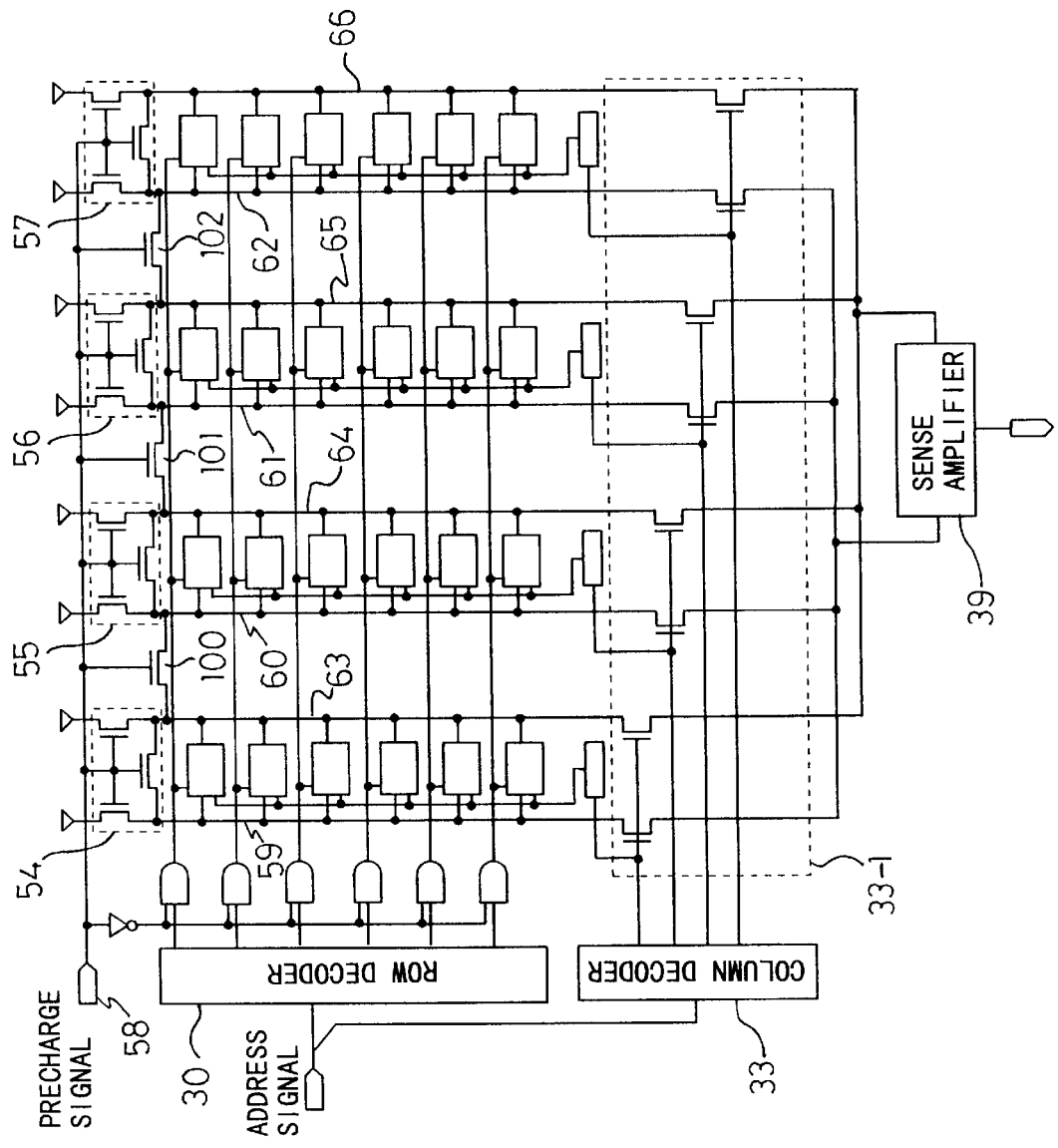
FIG. 5 is a block diagram showing a modification to the semiconductor storage device of FIG. 1.

A modification to the semiconductor storage device of the embodiment described above which solves the problem just described is shown in FIG. 5.

Referring to FIG. 5, the modified semiconductor storage device shown is in the form of a RAM and is constructed such that bit lines 59 to 62 and complementary bit lines 63 to 66 are precharged and equalized in the same columns by precharging and equalization circuits. The sources and the drains of transistors 100 to 102 are connected between bit lines and complementary bit lines of adjacent columns. The gates of the transistors 100 to 102 are connected to a precharge signal 58. Since the transistors 100 to 102 equalize the bit lines and the complementary bit lines of the adjacent columns during a precharging period, all of the bit lines 59 to 62 and the complementary bit lines 63 to 66 are connected and equalized to each other by the transistors. Consequently, equalization of a selected column and equalization of non-selected columns can be performed in an equal time, and equalization of a selected column can be performed in a shorter time.

Another modification to the semiconductor storage device of the embodiment described above is shown in FIGS. 6, 7 and 8.

Figure 6:
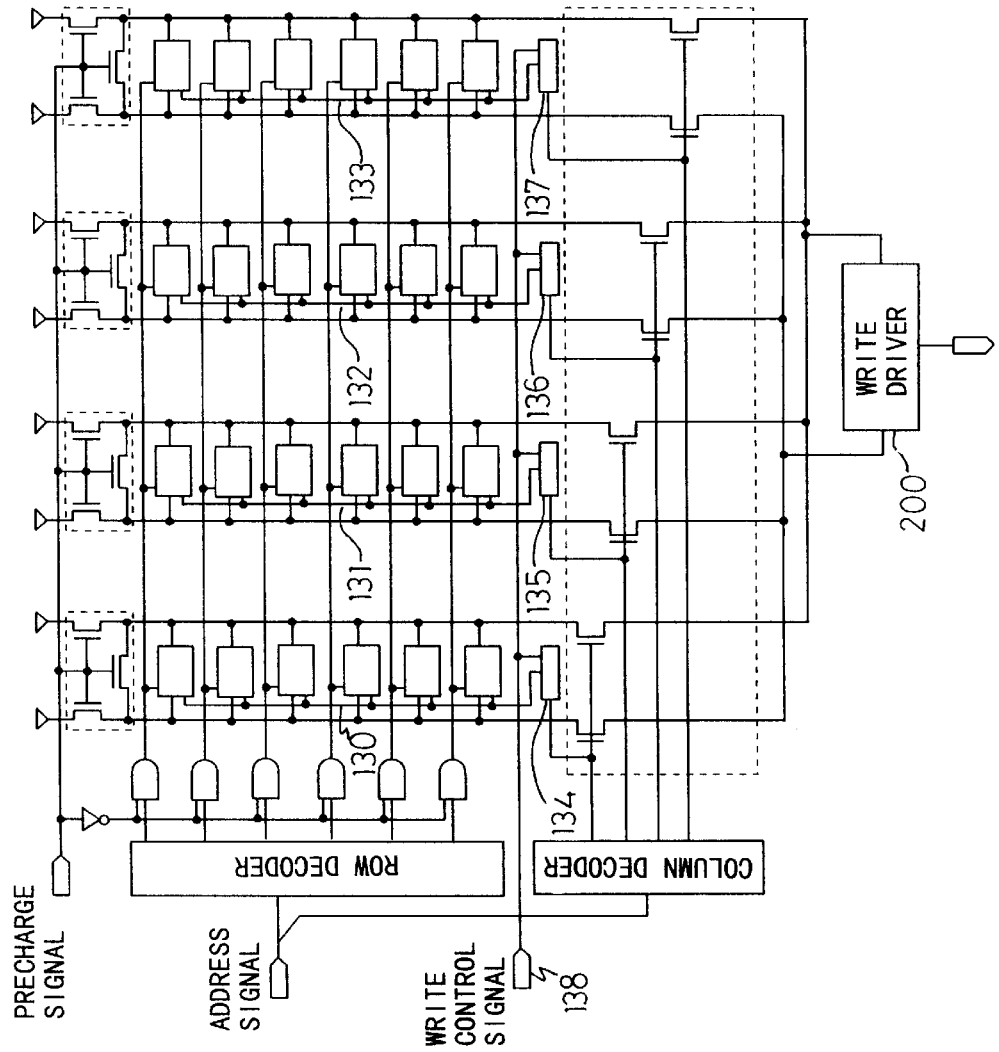
FIG. 6 is a similar view but showing another modification to the semiconductor storage device of FIG. 1.
Figure 7:
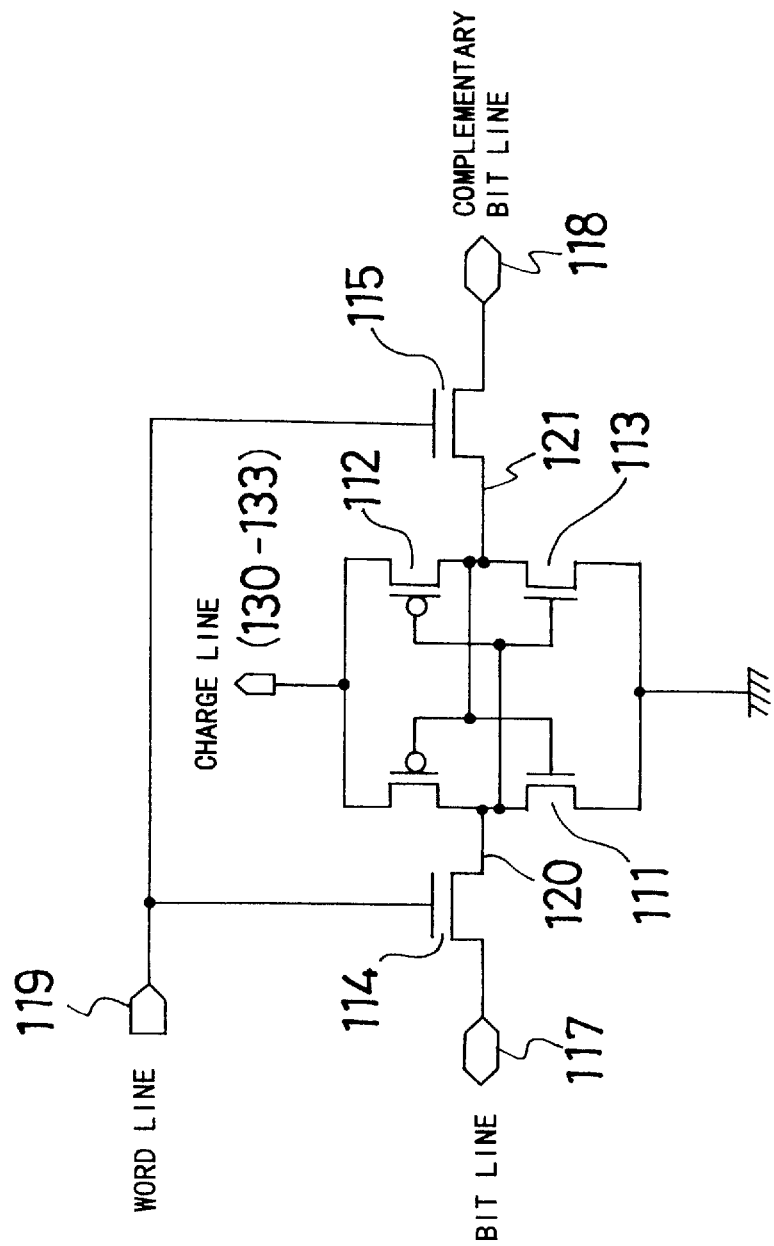
FIG. 7 is a circuit diagram of a RAM cell included in the modified semiconductor storage device of FIG. 6.

Referring to FIG. 7, the source nodes of PMOS transistors 110 and 112 of a RAM cell are connected to a charge line. Referring to FIG. 6, the source nodes of RAM cells are connected to charge lines 130 to 133 common for individual columns and connected to current limiting circuits 134 to 137. A write control signal 138 is connected to the current limiting circuits 134 to 137.

Figure 8:
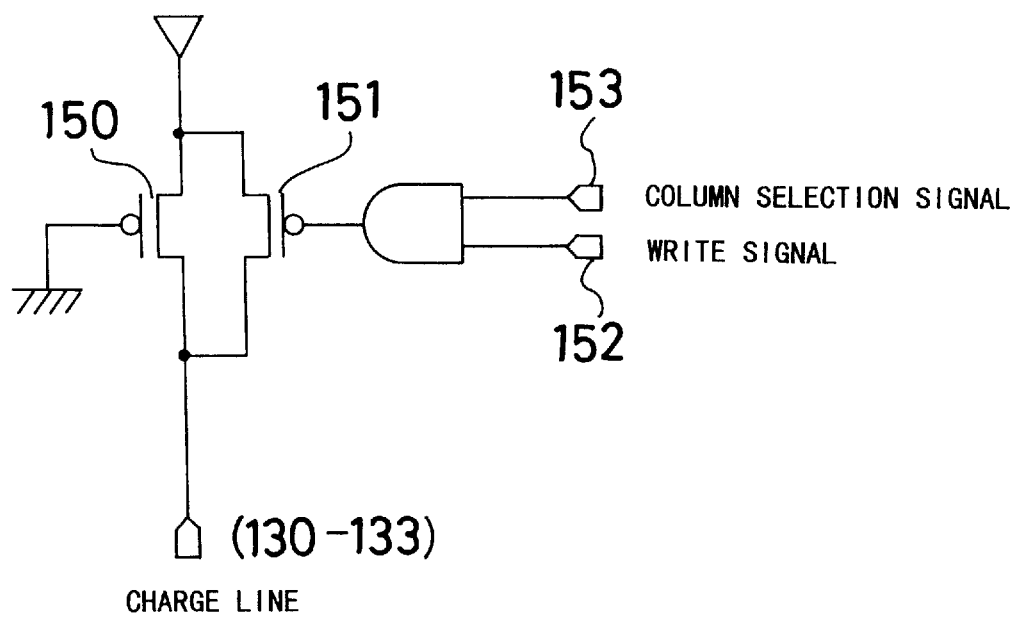
FIG. 8 is a circuit diagram of a current limiting circuit included in the modified semiconductor storage device of FIG. 6.
Figure 9:
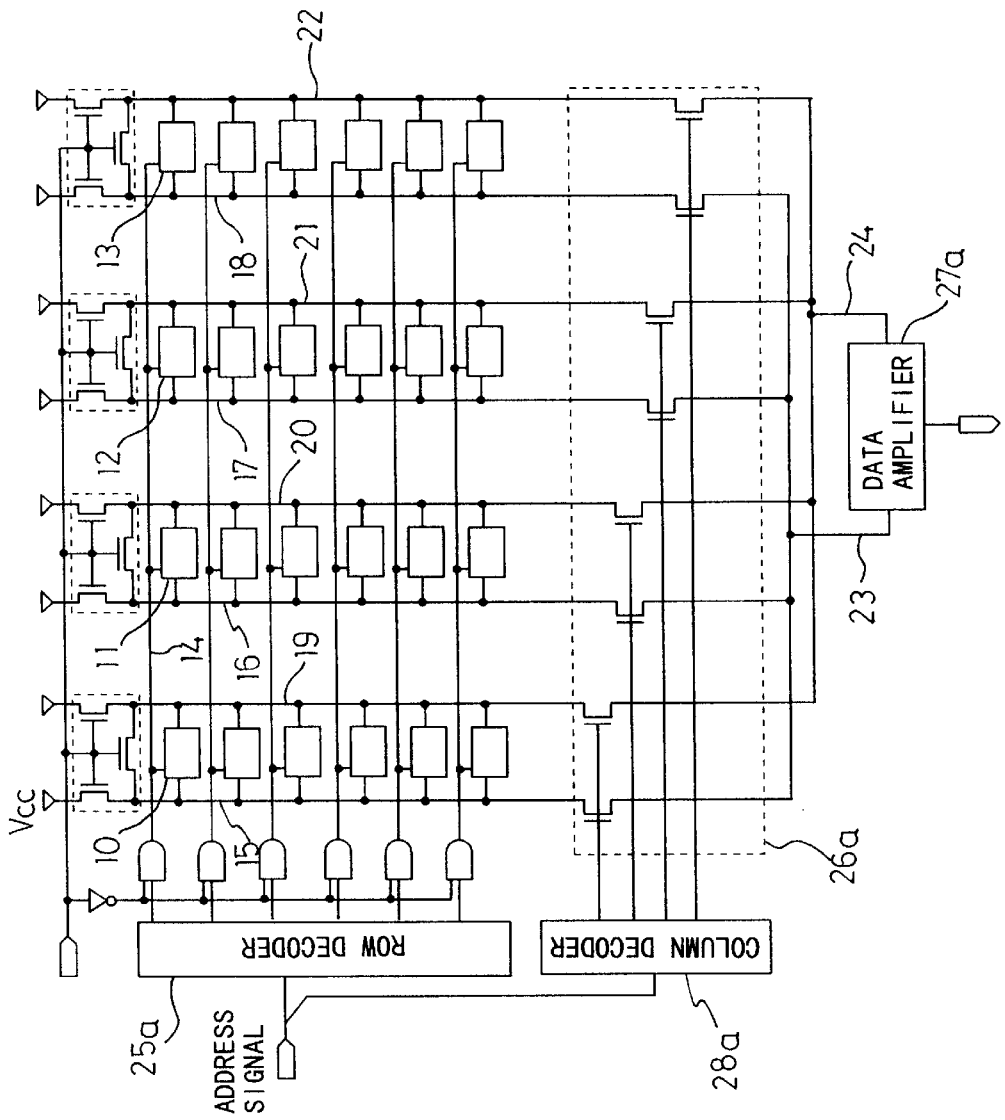
FIG. 9 is a block diagram of a conventional semiconductor storage device.
Figure 10:
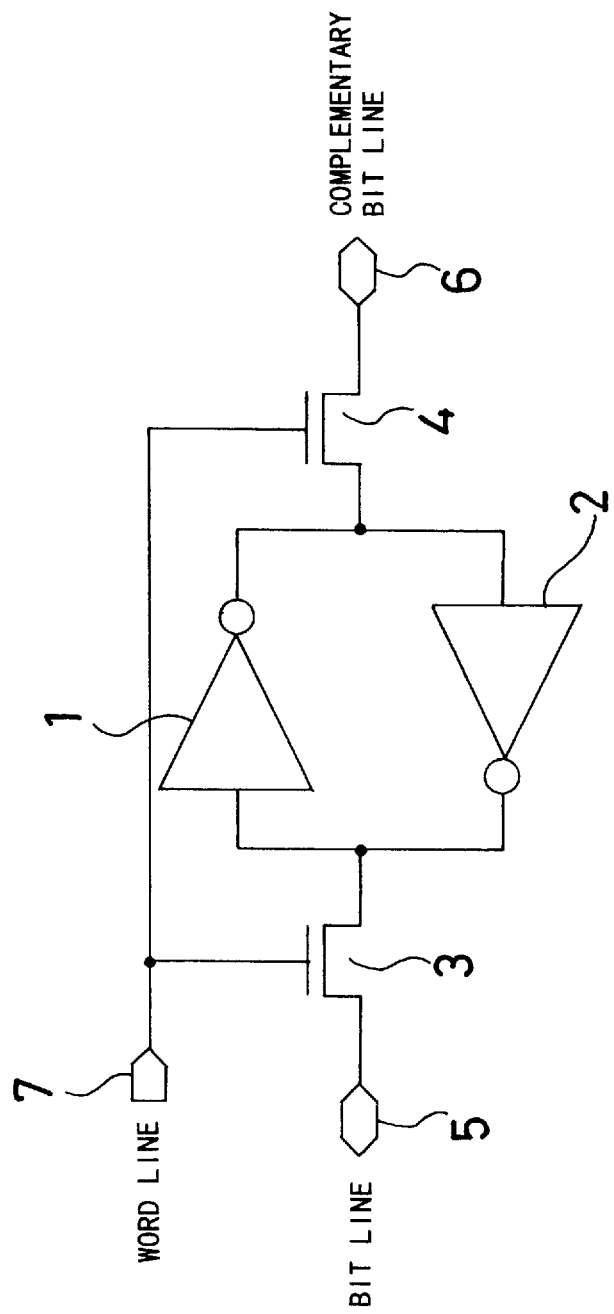
FIG. 10 is a circuit diagram of a RAM cell included in the semiconductor storage device of FIG. 9.
Figure 11:
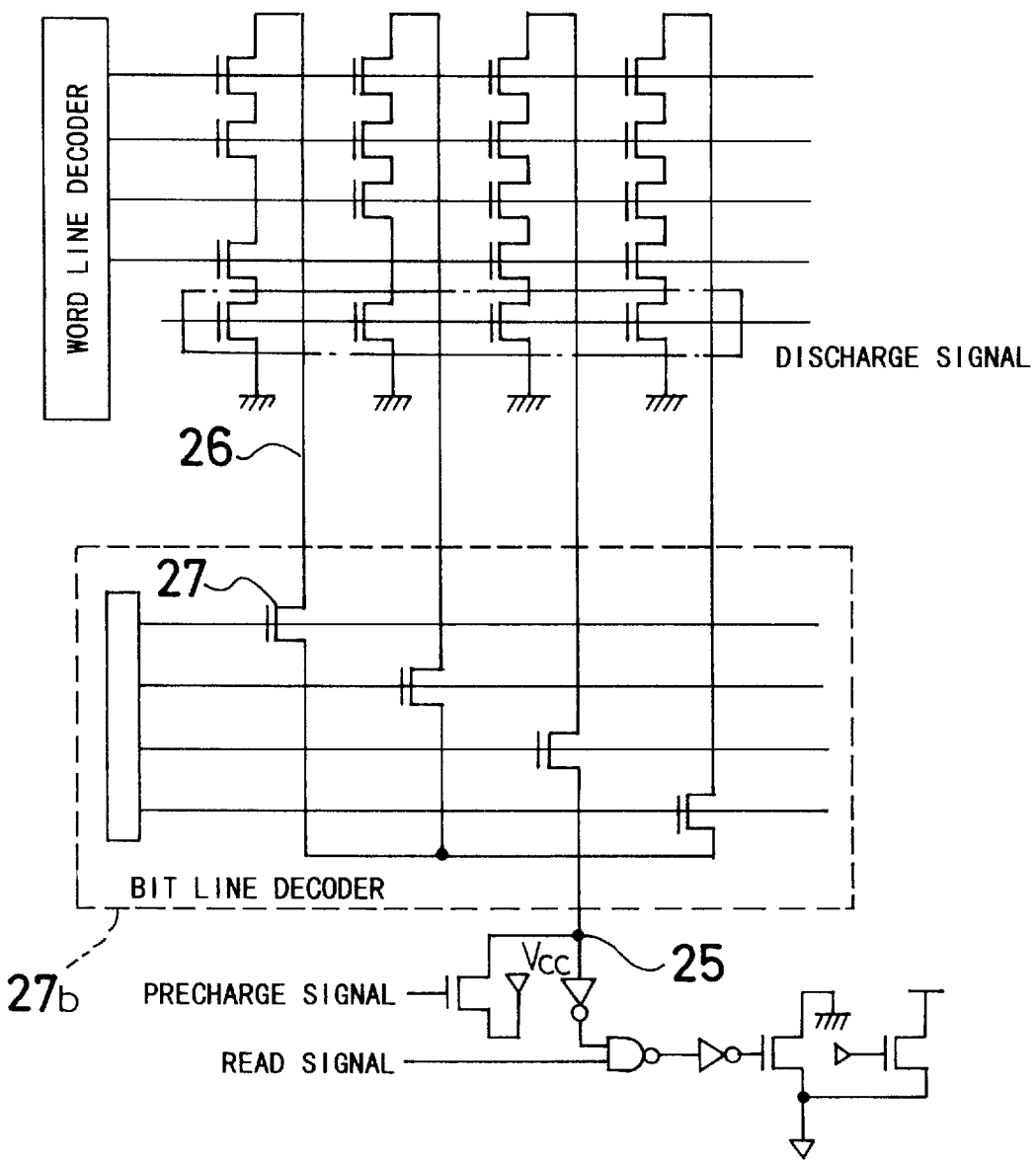
FIG. 11 is a block diagram of a conventional ROM cell.

An example of construction of each of the current limiting circuits 134 to 137 is shown in FIG. 8. Referring to FIG. 8, the gate of a transistor 150 is connected to a ground line and the transistor 150 normally exhibits an on-state. Another transistor 151 is connected in parallel to the transistor 150 and receives, at the gate thereof, a logical AND signal of a write control signal 152 and a column selection signal 153. When the write control signal 152 and the column selection signal 153 are active, the transistor 151 exhibits an off-state, in which the current to flow along a charge line decreases comparing with that when the transistor 151 is on.

RAM cells of a column selected when the write control signal and the column selection control signal therefor are active first perform a precharging operation and then perform a writing operation. In this instance, since the current to flow from the charge line to the power supply line in the selected column is limited to a low value comparing with that in each non-selected column, the switching voltage of the invertor in each of the RAM cells in the selected column drops and the gain coefficient of the PMOS transistor of the RAM cell decreases. When to write "1" while the RAM cell has the value "0", a bit line 117 is driven to a HIGH level while a complementary bit line 118 is driven to a LOW level by a write driver 200. Thereupon, since the switching voltage of the invertor formed from the transistors 150, 112 and 113 is low, the invertor mentioned above reverses by a little voltage rise at the node 120. Further, since the gain coefficient of the PMOS transistor of the invertor is low, the potential of the node 121 varies to a LOW level at a high speed, and also the current to flow to the node 121 is decreased.

From those reasons, the writing time into a RAM cell is reduced and the power consumption is reduced. Further, since the present storage device can be realized by replacing the power supply wiring lines with the charge wiring lines, the storage device is free from an increase in area and can be realized with a high degree of integration.

Having now fully described the invention, it will be apparent to one of ordinary skill in the art that many changes and modifications can be made thereto without departing from the spirit and scope of the invention as set forth herein.

What is claimed is:

1. A semiconductor storage device, comprising:

a memory cell array including a plurality of bit line pairs, a plurality of word lines and a plurality of memory cells arranged in a matrix and individually connected to corresponding ones of said bit line pairs and said word lines;

a column selection circuit for selecting one of said bit line pairs in response to a column selection signal and connecting the selected bit line pair to a pair of data lines;

a current line connected commonly to those of said memory cells which are disposed in each of the columns in said memory array; and a respective current limiting circuit interposed between each of the current lines and a power supply line, the current flowing through each of the circuit limiting circuits being variable in response to the column selection signal.

2. A semiconductor storage device as claimed in claim 1, wherein, when said bit line pairs are precharged, adjacent ones of said bit line pairs are equalized.

3. A semiconductor storage device as claimed in claim 1, further comprising:

first and second invertors having input and output nodes connected such that the input and output of each one of said first and second invertors are connected to the output and input nodes of the other of said first and second converters, said first and second invertors further having power supply nodes which are connected commonly to each other; and a current source interposed between said power supply nodes and said power supply line for receiving a control signal and for supplying, when the control signal is in a first logic state, first current, but supplying, when the control signal is in a second logic state, second current which is higher than the first current.

4. A semiconductor storage device as claimed in claim 3, wherein said current source includes a current mirror circuit whose output current varies in response to the logic state of the control signal.

5. A semiconductor storage device as claimed in claim 3, wherein said current source includes a plurality of transistors connected in parallel to each other, and the number of those of said transistors which are controlled to a conducting state is determined in response to the logic state of the control signal.

6. A semiconductor storage device, comprising:

a plurality of memory cells arranged in a matrix;

a write driver for writing data into those of said memory cells selected in response to a column selection signal;

a current line connected commonly to those of said memory cells which are disposed in each of columns of the matrix; and a current limiting circuit interposed between each of the current lines and a power supply line; and wherein current to flow through said current limiting circuit upon writing of data by said write driver is varied in response to the column selection signal.

7. A semiconductor storage device as claimed in claim 6, further comprising:

first and second invertors having input and output nodes connected such that the input and output of each one of said first and second invertors are connected to the output and input nodes of the other of said first and second converters, said first and second invertors further having power supply nodes which are connected commonly to each other; and a current source interposed between said power supply nodes and said power supply line for receiving a control signal and for supplying, when the control signal is in a first logic state, first current, but supplying, when the control signal is in a second logic state, second current which is higher than the first current.

8. A semiconductor storage device as claimed in claim 6, wherein said current source includes a current mirror circuit whose output current varies in response to the logic state of the control signal.

9. A semiconductor storage device as claimed in claim 6, wherein said current source includes a plurality of transistors connected in parallel to each other, and the number of those of said transistors which are controlled to a conducting state is determined in response to the logic state of the control signal.

* * * * *